(12) United States Patent
Song

(10) Patent No.: US 9,721,623 B2
(45) Date of Patent: Aug. 1, 2017

(54) MEMORY APPARATUS USING PLURALITY OF POWER SOURCES AND SYSTEM INCLUDING THE SAME

(71) Applicant: SK hynix Inc., Icheon-si, Gyeonggi-do (KR)

(72) Inventor: Keun Soo Song, Icheon-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days.

(21) Appl. No.: 14/950,260

(22) Filed: Nov. 24, 2015

(65) Prior Publication Data

US 2017/0040041 A1 Feb. 9, 2017

(30) Foreign Application Priority Data

Aug. 4, 2015 (KR) .................. 10-2015-0109846

(51) Int. Cl.
| | | |
|---|---|---|
| *G11C 7/10* | (2006.01) | |
| *G11C 5/14* | (2006.01) | |
| *G11C 7/22* | (2006.01) | |
| *G11C 5/06* | (2006.01) | |
| *G11C 5/02* | (2006.01) | |

(52) U.S. Cl.
CPC ............ *G11C 5/147* (2013.01); *G11C 5/025* (2013.01); *G11C 5/063* (2013.01); *G11C 5/14* (2013.01); *G11C 7/10* (2013.01); *G11C 7/22* (2013.01); *G11C 7/222* (2013.01)

(58) Field of Classification Search
CPC .............. G11C 5/14; G11C 5/147; G11C 7/10
USPC .................. 365/226, 189.17, 189.05, 206
See application file for complete search history.

(56) References Cited

U.S. PATENT DOCUMENTS

| | | | | |
|---|---|---|---|---|
| 6,031,785 | A * | 2/2000 | Park ................ | G11C 7/1018 365/189.04 |
| 6,452,269 | B1 * | 9/2002 | Ohbayashi ............ | H01L 23/50 257/666 |
| 6,621,329 | B2 * | 9/2003 | Kajimoto ........... | H03K 19/0175 327/540 |
| 2001/0038106 | A1 * | 11/2001 | Coteus ................ | G11C 7/1051 257/200 |
| 2003/0080717 | A1 * | 5/2003 | Kajimoto ........... | H03K 19/0175 323/273 |
| 2006/0002222 | A1 * | 1/2006 | Lee ....................... | G11C 5/025 365/226 |
| 2008/0001656 | A1 | 1/2008 | Takeuchi | |
| 2008/0291754 | A1 * | 11/2008 | Nakai .................. | G11C 5/147 365/189.14 |
| 2011/0193620 | A1 * | 8/2011 | Hollis .................. | G11C 5/14 327/538 |
| 2015/0070052 | A1 | 3/2015 | Hollis | |

* cited by examiner

*Primary Examiner* — Amir Zarabian
*Assistant Examiner* — Jay Radke
(74) *Attorney, Agent, or Firm* — William Park & Associates Ltd.

(57) ABSTRACT

A memory apparatus may include first to third pads to provide first to third voltages, respectively, to internal circuits. The first pad may receive a first external voltage, and provide the first voltage. The second and third pads may receive a second external voltage. The second pad may provide the second voltage, and the third pad may provide the third voltage.

6 Claims, 4 Drawing Sheets

MEMORY APPARATUS USING PLURALITY OF POWER SOURCES AND SYSTEM INCLUDING THE SAME

CROSS-REFERENCES TO RELATED APPLICATION

The present application claims priority under 35 U.S.C. §119(a) to Korean application number 10-2015-0109846 filed on Aug. 4, 2015, in the Korean Intellectual Property Office, which is incorporated herein by reference in its entirety.

BACKGROUND

1. Technical Field

Various embodiments generally relate to a semiconductor apparatus, and more particularly to a memory apparatus using a plurality of power sources and a system including the same.

2. Related Art

A processor and a memory apparatus constituting an electronic system may communicate with one another by using a system bus. Each of the processor and the memory apparatus may include a transmitter circuit for transmitting data and a receiver circuit for receiving data. The transmitter and receiver circuits are coupled to one another through the system bus, which includes long signal lines. When the transmitter circuits transmit signals through the system bus, therefore, the electronic system increases power consumption.

The current technological trend with respect to the memory apparatus is to reduce power consumption while meeting high-speed data transfer requirements. Although use of lower voltages may decrease power consumption, lower-voltage signals may also cause unintended effects on the quality thereof by reducing the magnitude of the voltage swings.

SUMMARY

Various embodiments are directed to a memory apparatus that has separate power supplies for data transmission and data reception, and a system including the same.

Various embodiments are directed to a memory apparatus that has separate power supplies for data transmission, data reception, and a peripheral circuit, and a system including the same.

In an embodiment, a memory apparatus may include a first pad configured to receive a first external voltage, and provide a first power, a second pad configured to receive a second external voltage, and provide a second power, and a third pad configured to receive the second external voltage, and provide a third power.

In an embodiment, a memory apparatus may include a data transmitter configured to output data by using a first power received through a first pad, a data receiver configured to receive data by using a second power received through a second pad, a serialization unit configured to generate data to be outputted through the data transmitter, from data stored in the memory apparatus, by using a third power received through a third pad, and a parallelization unit configured to align data received through the data receiver, by using the third power.

In an embodiment, a system may include a processor, a power management device configured to provide first and second external voltages, and a memory apparatus configured to communicate with the processor, and operate by using the first external voltage as a first power and the second external voltage as second and third powers, the memory apparatus including a first pad configured to couple the first external voltage with a first power line, a second pad configured to couple the second external voltage with a second power line, and a third pad configured to couple the second external voltage with a third power line.

DETAILED DESCRIPTION

Hereinafter, a memory apparatus using a plurality of power sources and a system including the same will be described below with reference to the accompanying drawings through various examples of embodiments.

Figure 1:
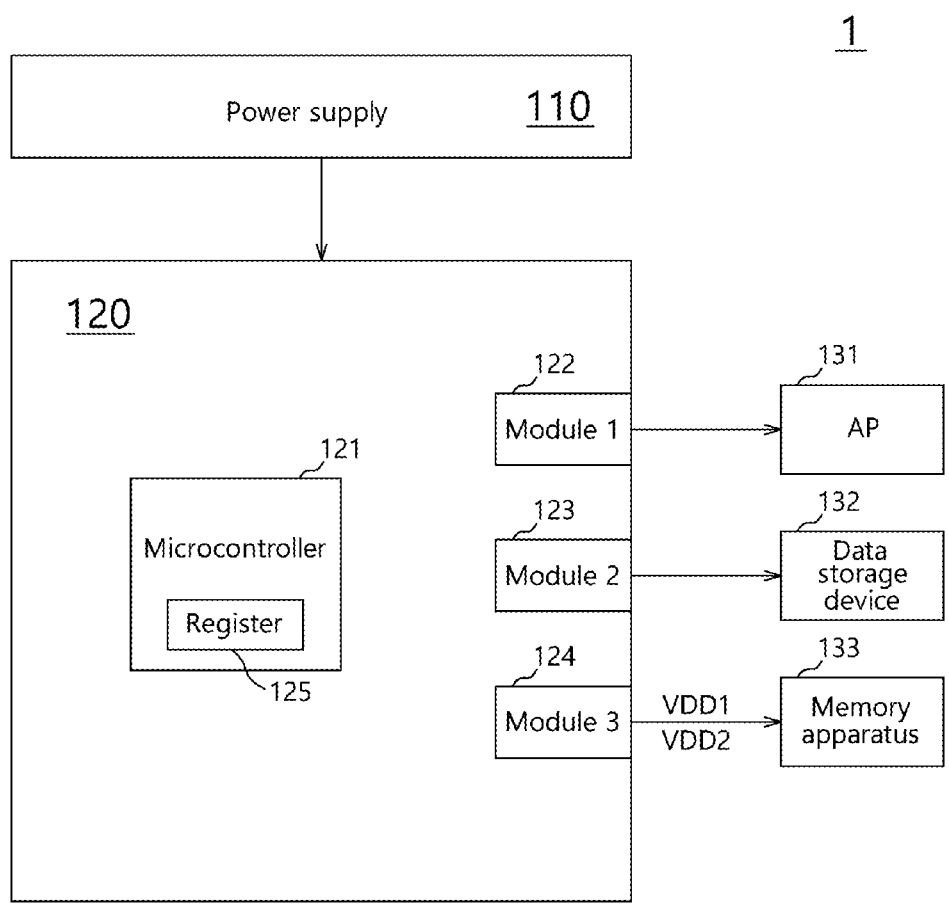
FIG. 1 is a diagram illustrating an example of a system in accordance with an embodiment.

FIG. 1 is a diagram illustrating an example of a system 1 in accordance with an embodiment. In FIG. 1, the system 1 schematically shows a configuration for providing power to components of an electronic device. The system 1 may include a power supply 110 and a power management integrated circuit 120. The power supply 110 may convert alternating current into direct current for the system 1 to operate with the direct current. Examples of the power supply 110 may include various kinds of batteries.

The power management integrated circuit 120 may allow the system 1 to be powered by the power supply 110. The power management integrated circuit 120 may be coupled to various devices constituting the system 1. For example, the power management integrated circuit 120 may be coupled to a system IC such as an application processor 131, a data storage device 132, and a memory apparatus 133. The power management integrated circuit 120 may convert high-voltage current to low-voltage current suitable for consumption by microchips such as an application processor 131, a data storage device 132, and a memory apparatus 133.

The power management integrated circuit 120 may include a microcontroller 121, and a plurality of modules 122, 123, and 124. The microcontroller 121 may have information on low-voltage current suitable for consumption by microchips constituting the system 1 and sequences or algorithms for generating the appropriate low-voltage current. The plurality of modules 122, 123, and 124 may be coupled to the application processor 131, the data storage device 132, and the memory apparatus 133, respectively, and each may include DC-to-DC converters such as voltage regulators for providing low-voltage current suitable for consumption by components such as an application processor 131, a data storage device 132, and a memory apparatus 133.

The microcontroller 121 may include a register 125 for storing the sequences or algorithms, and the register 125 may include an embedded nonvolatile memory. The register 125 may store the information such as low-voltage current suitable for consumption by the application processor 131, the data storage device 132, and the memory apparatus 133, the sequences to be executed by the microcontroller 121, and information on trimming of the plurality of modules 122, 123 and 124.

The application processor 131, the data storage device 132, and the memory apparatus 133 may be components of an electronic device such as a smart phone, a tablet PC, a netbook, a personal wireless communication device, a portable multimedia device, or the like. The application processor 131, the data storage device 132, and the memory apparatus 133 may operate by using power supply voltages provided from the power management integrated circuit 120. The application processor 131 may support applications running in an operation system in the electronic device, and perform various calculation functions. The memory apparatus 133 may be a system memory which stores information on the operation system, stores data processed by the application processor 131, and stores data generated as a result of the calculation functions. Also, the memory apparatus 133 may function as a data buffer for storing data and transmitting stored data to the application processor 131 in response to various control signals of the application processor 131. The memory apparatus 133 may include one or more volatile memory apparatuses such as a static RAM (SRAM), a dynamic RAM (DRAM), and a synchronous DRAM (SDRAM), and/or one or more nonvolatile memory apparatuses such as a read only memory (ROM), a programmable ROM (PROM), an electrically erasable and programmable ROM (EEPROM), an electrically programmable ROM (EPROM), a flash memory, a phase change RAM (PRAM), a magnetic RAM (MRAM), a resistive RAM (RRAM), and a ferroelectric RAM (FRAM). The data storage device 132 may be a solid state drive which includes a plurality of flash memories.

The memory apparatus 133 may operate by using two different voltage sources. The memory apparatus 133 may receive first and second external voltages VDD1 and VDD2 from the power management integrated circuit 120. The level of the first external voltage VDD1 may be different from the level of the second external voltage VDD2. For example, the level of the first external voltage VDD1 may be lower than the level of the second external voltage VDD2. The memory apparatus 133 may utilize the first and second external voltages VDD1 and VDD2 as various operating voltages.

Figure 2:
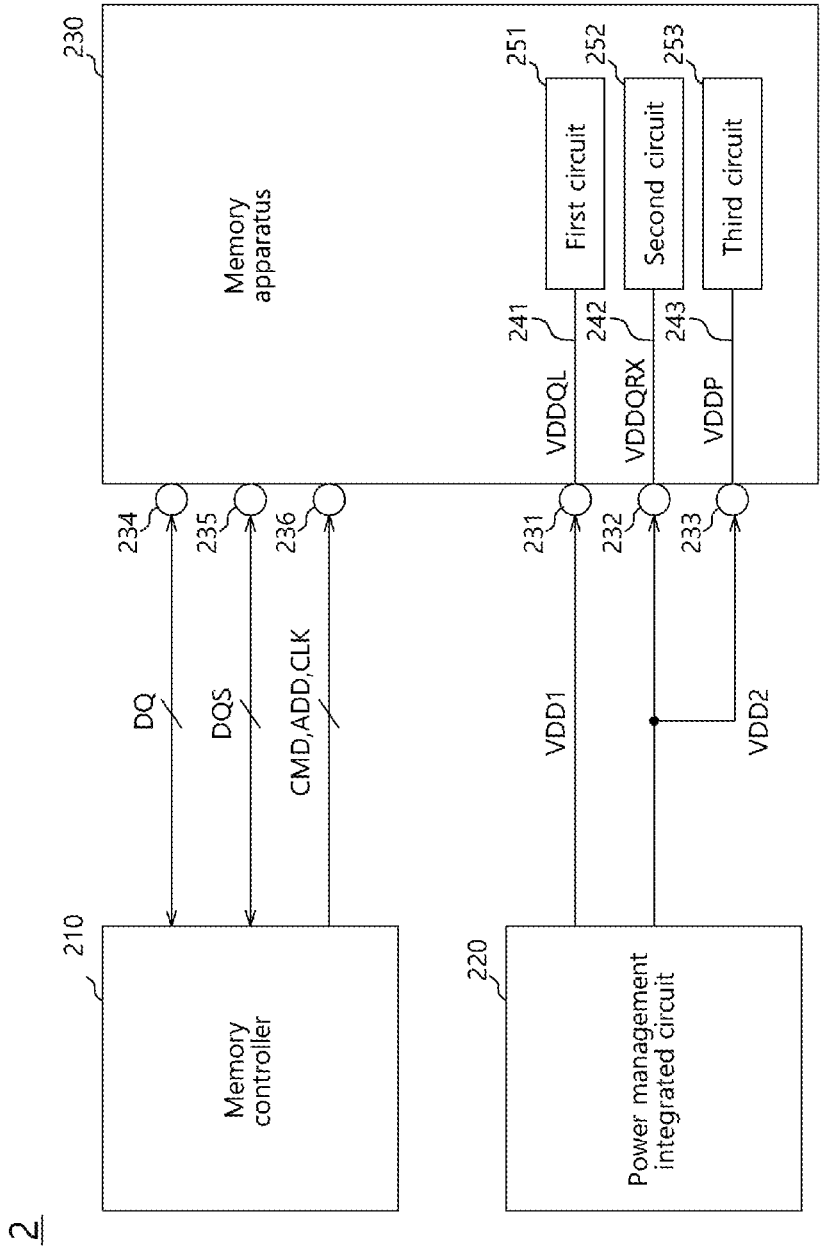
FIG. 2 is a diagram illustrating an example of a system in accordance with an embodiment.

FIG. 2 is a diagram illustrating a representation of an example of the configuration of a system 2 in accordance with an embodiment. In FIG. 2, the system 2 may include a memory controller 210, a power management integrated circuit 220, and a memory apparatus 230. The memory controller 210 may control the memory apparatus 230 by communicating therewith. The memory controller 210 may transmit and receive data DQ and transmit and receive a data strobe signal DQS for a data communication with the memory apparatus 230. Further, the memory controller 210 may provide a command signal CMD, an address signal ADD, and a clock signal CLK to control the operation of the memory apparatus 230.

The power management integrated circuit 220 may apply voltages necessary for the operation of the memory apparatus 230. For example, the power management integrated circuit 220 may apply first and second external voltages VDD1 and VDD2 to the memory apparatus 230. The memory apparatus 230 may operate by using the first and second external voltages VDD1 and VDD2 which have different voltage levels. In an embodiment, the memory controller 210 and the power management integrated circuit 220 may be separate components that operate independently of each other. In an embodiment, the memory controller 210 and the power management integrated circuit 220 may be components that are disposed in one processor device.

The memory apparatus 230 may include a plurality of pads. The plurality of pads may be connected to packaging balls when the memory apparatus 230 is packaged in a memory module. The memory apparatus 230 may receive various signals and power-supply voltages through the plurality of pads. In FIG. 2, the memory apparatus 230 may include first to third power pads 231, 232, and 233. The first power pad 231 may receive the first external voltage VDD1 from the power management integrated circuit 220. The second power pad 232 may receive the second external voltage VDD2 from the power management integrated circuit 210.

The memory apparatus 230 may be coupled to the memory controller 210 through other pads. The memory apparatus 230 may include a data pad 234 to transmit and receive the data DQ to and from the memory controller 210. The memory apparatus 230 may further include a data strobe pad 235 to transmit and receive the data strobe signal DQS to and from the memory controller 210. Moreover, the memory apparatus 230 may further include a pad 236 to receive the command signal CMD, the address signal ADD, and the clock signal CLK from the memory controller 210.

The memory apparatus 230 may use the first external voltage VDD1 received through the first power pad 231 as a first voltage VDDQL. The memory apparatus 230 may use the second external voltage VDD2 received through the second power pad 232 as a second voltage VDDQRX. In addition, the memory apparatus 230 may use the second external voltage VDD2 received through the third power pad 233 as a third voltage VDDP. The first to third power pads 231, 232, and 233 may be coupled to first to third power lines 241, 242, and 243, respectively. The first to third power lines 241, 242, and 243 may each form a power mesh in the memory apparatus 230. The first to third power lines 241, 242 and 243 may be respectively coupled to various internal circuits. The first power line 241 may be a power mesh that supplies the first voltage VDDQL, the second power line 242 may be a power mesh that supplies the second voltage VDDQRX, and the third power line 243 may be a power mesh that supplies the third voltage VDDP. The first to third power lines 241, 242, and 243 may not be coupled to one another.

The memory apparatus 230 may include various internal circuits to store data transmitted from the memory controller 210 and output stored data therein. In FIG. 2, the memory apparatus 230 may include first to third circuits 251, 252, and 253. The first circuit 251 may operate by using the first voltage VDDQL applied through the first power line 241. The second circuit 252 may operate by using the second voltage VDDQRX applied through the second power line 242. The third circuit 253 may operate by using the third voltage VDDP applied through the third power line 243. The first to third circuits 251, 252, and 253 may also use a ground voltage in addition to the first to third voltages VDDQL, VDDQRX and VDDP. The ground voltage may be applied through another power pad.

Figure 3:
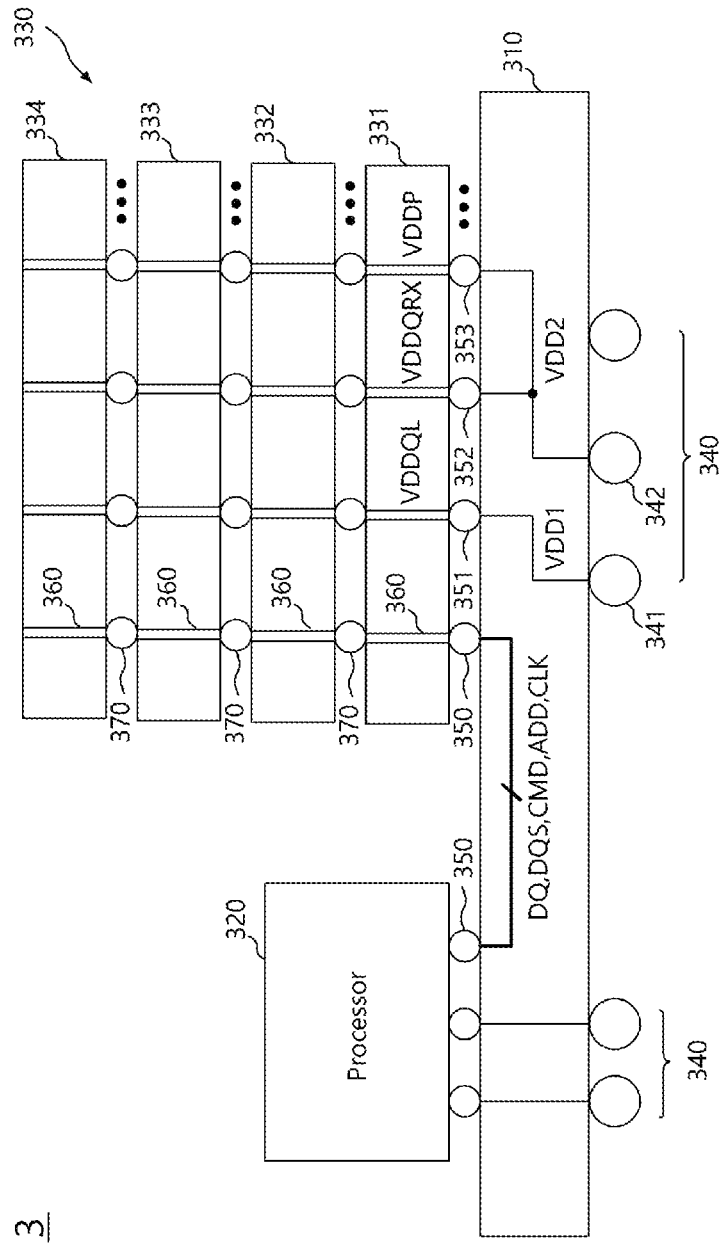
FIG. 3 is a diagram illustrating an example of a system in accordance with an embodiment.

FIG. 3 is a diagram illustrating an example of a system 3 in accordance with an embodiment. In FIG. 3, the system 3 may include a substrate 310, a processor 320, and a memory apparatus 330. The substrate 310 may be a silicon substrate. The substrate 310 may be an interposer which provides signal paths between the processor 320 and the memory apparatus 330. The signal paths may include conducting layers such as metal layers or through-silicon vias. The substrate 310 may include various logic circuits to assist in performing data communication between processor 320 and the memory apparatus 330, and those logic circuits may also form signal paths. The substrate 310 may be coupled to an external device through package balls 340 such as a ball grid array, bump balls, and C4 bumps. The external device may be a host device coupled to the system 3. The substrate 310 may be coupled to the processor 320 and the memory apparatus 330 through micro bumps 350. The system 3 may be a system-in-package, a system-on-chip, a flip chip package, a multi-chip package, or a package-on-package.

The processor 320 may receive a request from the host device, and generate data DQ, a data strobe signal DQS, a command signal CMD, an address signal ADD, and a clock signal CLK to be transmitted to the memory apparatus 330 based on the request. The processor 320 may control read and write operations of the memory apparatus 330. During the write operation, the processor 320 may provide the data DQ, the data strobe signal DQS, the command signal CMD, the address signal ADD, and the clock signal CLK to the memory apparatus 330. During the read operation, the processor 320 may provide the command signal CMD, the address signal ADD, and the clock signal CLK to the memory apparatus 330, and the memory apparatus 330 may provide the data DQ and the data strobe signal DQS to the processor 320. While FIG. 3 shows an example in which the command signal CMD, the address signal ADD and the clock signal CLK are used as signals for the processor 320 to control the memory apparatus 330, it is to be noted that the embodiment is not limited thereto. Any signal necessary for the operation of the memory apparatus 330, such as a chip select signal, may be included in signals for controlling the memory apparatus 330.

The memory apparatus 330 may be a stacked memory apparatus which includes a plurality of stacked chips 331, 332, 333 and 334. The plurality of stacked chips 331, 332, 333 and 334 may be memory chips that are coupled to one another through through-silicon vias 360 and micro bumps 370. The plurality of stacked chips 331, 332, 333, and 334 may include data storage spaces such as memory banks to store data transmitted from the processor 320.

The plurality of stacked chips 331, 332, 333, and 334 may receive first and second external voltages VDD1 and VDD2, and operate by using three or more operating voltage. The first external voltage VDD1 may be applied through a first package ball 341 and a first power pad 351. The second external voltage VDD2 may be applied through a second package ball 342 and second and third power pads 352 and 353. As described above, the first to third power pads 351, 352, and 353 may be micro bumps. The first power pad 351 may apply a first voltage VDDQL to the plurality of stacked chips 331, 332, 333, and 334, the second power pad 352 may apply a second voltage VDDQRX to the plurality of stacked chips 331, 332, 333, and 334, and the third power pad 353 may apply a third voltage VDDP to the plurality of stacked chips 331, 332, 333, and 334. The first to third voltages VDDQL, VDDQRX and VDDP may be applied to the plurality of stacked chips 331, 332, 333, and 334 through the through vias 360 and the micro bumps 370.

Figure 4:
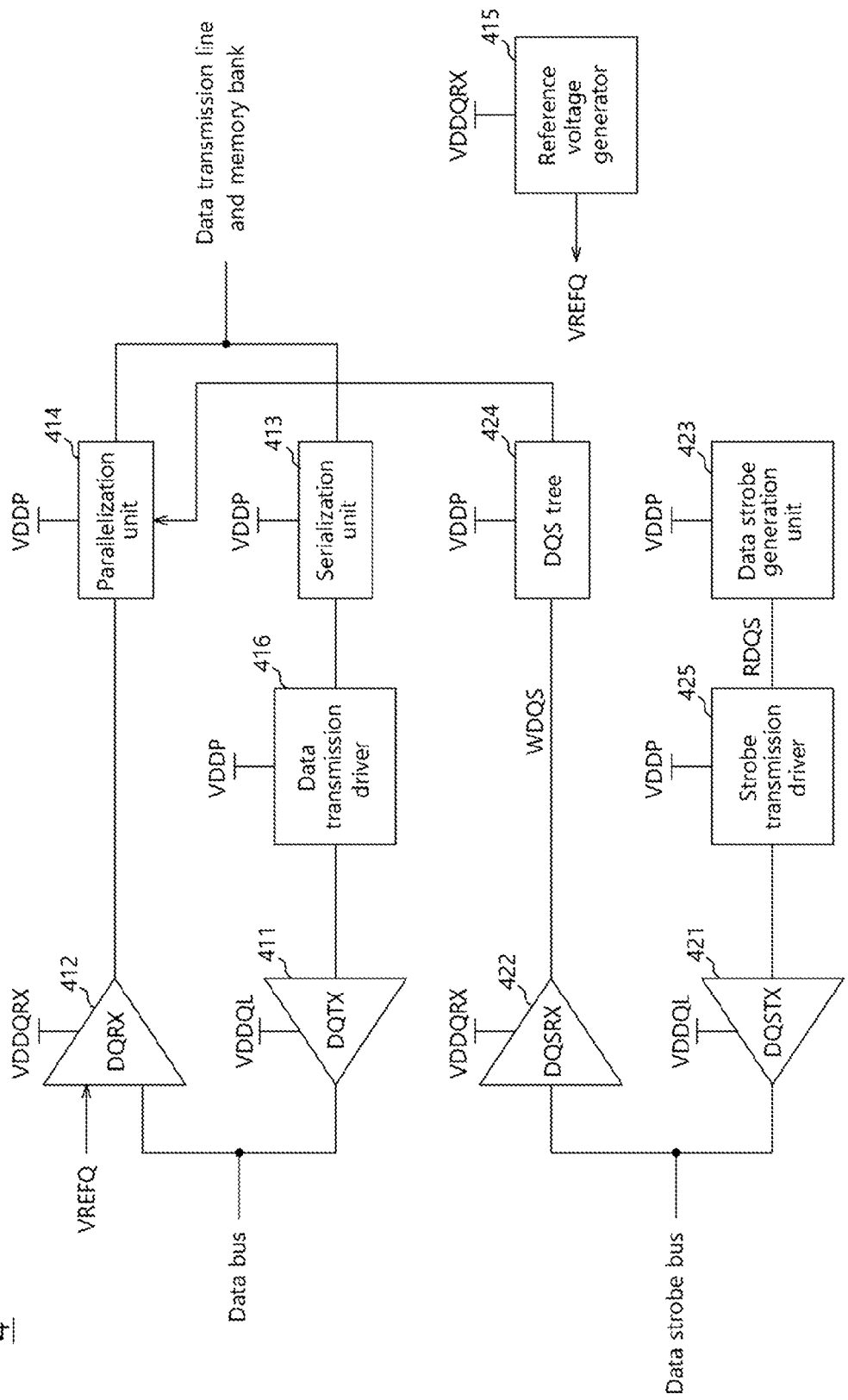
FIG. 4 is a diagram illustrating an example of a memory apparatus in accordance with an embodiment.

FIG. 4 is a diagram illustrating an example of a memory apparatus 4 in accordance with an embodiment. In FIG. 4, the memory apparatus 4 may be coupled to an external device through a data bus and a data strobe bus. The external device may be the processor or the memory controller shown in FIGS. 1 to 3. The memory apparatus 4 may include a data transmitter 411, a data receiver 412, and peripheral circuits. The data transmitter 411 and the data receiver 412 may be coupled between the data bus and the peripheral circuit. The data transmitter 411 may transmit data stored in the memory apparatus 4 to the external device through the data bus. The data receiver 412 may receive data transmitted through the data bus from the external device.

The peripheral circuits may include a serialization unit 413 and a parallelization unit 414. In an embodiment, the peripheral circuits may further include other logic circuits that are not shown in FIG. 4 to store or output data. The serialization unit 413 may convert parallel data stored in a memory bank of the memory apparatus 4 and transmitted through data transmission lines into serial data, and output converted data to the data transmitter 411. Examples of the serialization unit 413, which outputs parallel data as serial data, may include a pipe latch. The parallelization unit 414 may output serial data received through the data receiver 412 as parallel data by converting the serial data into the parallel data. The data converted by the parallelization unit 414 may be stored in the memory bank through the data transmission lines of the memory apparatus 4. The parallelization unit 414 may be, for example, a data alignment circuit for outputting serial data as parallel data.

The data transmitter 411 may correspond to the first circuit 251 of FIG. 2, the data receiver 412 may correspond to the second circuit 252 of FIG. 2, and the serialization unit 413 and the parallelization unit 414 may correspond to the third circuit 253 of FIG. 2. The data transmitter 411 may operate by using a first voltage VDDQL, the data receiver 412 may operate by using a second voltage VDDQRX, and the serialization unit 413 and the parallelization unit 414 may operate by using a third voltage VDDP. The voltage levels of the second and third voltages VDDQRX and VDDP may be substantially the same, and the voltage level of the first voltage VDDQL may be lower than the voltage levels of the second and third voltages VDDQRX and VDDP.

The data transmitter 411 may be a transmission circuit for transmitting a low-voltage-swing signal. The data transmitter 411 may be an N-over-N driver which drives the data bus according to a voltage level of a data signal to output by using the first voltage VDDQL with a relatively low voltage level. When the memory apparatus 4 and a processor perform a high-speed, low-power communication, the data receiver 412 should be able to precisely receive a low-voltage-swing signal. The data receiver 412 may be a reception circuit for receiving a low-voltage-swing data signal. Accordingly, the data receiver 412 may receive data transmitted through the data bus by using the second voltage VDDQRX which has a voltage level higher than the power supply voltage of the data transmitter 411.

The data receiver 412 may receive data by differentially amplifying the signal transmitted through the data bus based on a reference voltage VREFQ. The reference voltage VREFQ may have the voltage half way between the power supply voltage VDDQRX and the ground voltage. For example, the level of the reference voltage VREFQ may be half the magnitude of the voltage swing of the low-voltage-swing data signal transmitted through the data bus. The memory apparatus 4 may further include a reference voltage generator 415. The reference voltage generator 415 may operate by using the second voltage VDDQRX. The reference voltage generator 415 may generate the reference voltage VREFQ from the second voltage VDDQRX.

The memory apparatus 4 may further include a data transmission driver 416. The data transmission driver 416 may be coupled between the serialization unit 413 and the data transmitter 411. The data transmission driver 416 may drive an output signal of the serialization unit 413 and transmit the driven signal to the data transmitter 411. For example, the data transmission driver 416 may include pull-up and pull-down drivers, amplify serial data outputted from the serialization unit 413, and output an amplified signal to the data transmitter 411. The data transmission driver 416 may operate by using the third voltage VDDP.

The memory apparatus 4 may further include a data strobe transmitter 421 and a data strobe receiver 422. The data strobe transmitter 421 and the data strobe receiver 422 may be coupled to the external device through the data strobe bus. In a read operation, the data strobe transmitter 421 may transmit a read data strobe signal RDQS, which is generated in the memory apparatus 4, to the external device through the data strobe bus. In a write operation, the data strobe receiver 422 may receive a write data strobe signal WDQS which is transmitted through the data strobe bus from the external device. The data strobe transmitter 421 and the data transmitter 411 may constitute a data transmission circuit. The data strobe transmitter 421 may operate by using the same power supply voltage as the data transmitter 411. The data strobe transmitter 421 may operate by using the first voltage VDDQL. The data strobe receiver 422 may configure a data reception circuit in cooperation with the data receiver 412, and operate by using the same power as the data receiver 412. The data strobe receiver 422 may operate by using the second voltage VDDQRX.

The memory apparatus 4 may further include a data strobe generation unit 423 and a data strobe signal (DQS) tree 424. The data strobe generation unit 423 may generate the read data strobe signal RDQS in the read operation. The read data strobe signal RDQS may be a signal that is synchronized with a data signal outputted through the serialization unit 413 and the data transmitter 411 in the read operation. The data strobe signal tree 424 may control a timing of the write data strobe signal WDQS which is received through the data strobe receiver 422. The data strobe signal tree 424 may provide a timing-controlled write data strobe signal to the parallelization unit 414. The parallelization unit 414 may transmit aligned data signals to the data transmission lines and the memory bank in synchronization with the timing-controlled write data strobe signal. The data strobe generation unit 423 and the data strobe signal tree 424 may be included in the peripheral circuit. The data strobe generation unit 423 and the data strobe signal tree 424 may operate by using the third voltage VDDP.

The memory apparatus 4 may further include a strobe transmission driver 425. The strobe transmission driver 425 may be coupled between the data strobe generation unit 423 and the data strobe transmitter 421. The strobe transmission driver 425 may drive the read data strobe signal RDQS outputted from the data strobe generation unit 423, and output the driven signal to the data strobe transmitter 421. For example, the strobe transmission driver 425 may include pull-up and pull-down drivers, amplify the read data strobe signal RDQS outputted from the data strobe generation unit 423, and output an amplified signal to the data strobe transmitter 421. The strobe transmission driver 425 may operate by using the third voltage VDDP.

The memory apparatus 4 in accordance with an embodiment may use an appropriate power supply voltage in conformity with an operation characteristic of an internal circuit. The data transmitter 411 and the data strobe transmitter 421 of the memory apparatus 4 may respectively transmit low-voltage-swing data signals and data strobe signals by using the first voltage VDDQL. Accordingly, the memory apparatus 4 may be used in a system that performs high-speed, low-power communication. Also, the data receiver 412 and the data strobe receiver 422 of the memory apparatus 4 may respectively receive data signals and data strobe signals by using the second voltage VDDQRX. Accordingly, the data receiver 412 and the data strobe receiver 422 may respectively amplify the low-voltage-swing data signals and data strobe signals to the voltage level of the second voltage VDDQRX so that the memory apparatus 4 may receive precise signals. Furthermore, since peripheral circuits other than data-transmission circuits and data-reception circuits operate using the third voltage VDDP, the memory apparatus 4 may minimize the effects of noise or an unexpected voltage drop that would have otherwise occurred due to use of the same voltage in the peripheral circuits.

While various embodiments have been described above, it will be understood to those skilled in the art that the embodiments described are examples only. Accordingly, the memory apparatus using a plurality of power sources and the system including the same described herein should not be limited based on the described embodiments.

What is claimed is:

1. A memory apparatus comprising:
a data transmitter configured to output data by using a first voltage applied thereto through a first pad;
a data receiver configured to receive data by using a second voltage applied thereto through a second pad;
a serialization unit configured to generate data to be outputted through the data transmitter from data stored in the memory apparatus by using a third voltage applied thereto through a third pad;
a parallelization unit configured to align data received through the data receiver by using the third voltage;
a data strobe transmitter configured to transmit a read data strobe signal by using the first voltage;
a data strobe receiver configured to receive a write data strobe signal by using the second voltage;
a data strobe tree configured to control a timing of the write data strobe signal and output the controlled signal to the parallelization unit by using the third voltage; and
a data strobe generation unit configured to generate the read data strobe signal by using the third voltage.

2. The memory apparatus according to claim 1, further comprising:
a data transmission driver configured to drive an output signal of the serialization unit and provide the driven signal to the data transmitter, the data transmission driver operating by using the second voltage.

3. The memory apparatus according to claim 1, further comprising:
a reference voltage generator configured to generate a reference voltage by using the second voltage,
wherein the data receiver receives the data by differentially amplifying the data based on the reference voltage.

4. The memory apparatus according to claim 1, wherein the first pad provides the first voltage by using a first external voltage, and the second and third pads provide the second and third voltages, respectively, by using a second external voltage.

5. The memory apparatus according to claim 4, wherein a level of the first external voltage is lower than a level of the second external voltage.

6. The memory apparatus according to claim 1, further comprising:

a strobe transmission driver configured to drive the read data strobe signal, and output a driven signal to the data strobe transmitter, wherein the strobe transmission driver operates by using the third voltage.

* * * * *